United States Patent
Iwamoto et al.

(10) Patent No.: US 12,088,273 B2
(45) Date of Patent: Sep. 10, 2024

(54) ACOUSTIC WAVE DEVICE, HIGH-FREQUENCY FRONT END CIRCUIT, AND COMMUNICATION DEVICE

(71) Applicant: Murata Manufacturing Co., Ltd., Nagaokakyo (JP)

(72) Inventors: Hideki Iwamoto, Nagaokakyo (JP); Ryo Otsubo, Nagaokakyo (JP); Kohei Fujio, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 1403 days.

(21) Appl. No.: 15/889,312

(22) Filed: Feb. 6, 2018

(65) Prior Publication Data
US 2018/0159497 A1 Jun. 7, 2018

Related U.S. Application Data

(63) Continuation of application No. PCT/JP2016/075885, filed on Sep. 2, 2016.

(30) Foreign Application Priority Data

Sep. 7, 2015 (JP) .................. 2015-175941

(51) Int. Cl.
*H03H 9/02* (2006.01)
*H03H 9/25* (2006.01)

(52) U.S. Cl.
CPC .... *H03H 9/02574* (2013.01); *H03H 9/02559* (2013.01); *H03H 9/25* (2013.01)

(58) Field of Classification Search
CPC ........... H03H 9/02574; H03H 9/02559; H03H 9/02535

(Continued)

(56) References Cited

U.S. PATENT DOCUMENTS

2002/0145488 A1* 10/2002 Iwashita ............ H03H 9/02574
333/193
2005/0077982 A1* 4/2005 Funasaka ........... H03H 9/02574
333/195

(Continued)

FOREIGN PATENT DOCUMENTS

JP 08-316782 A 11/1996
JP 2005-354650 A 12/2005

(Continued)

OTHER PUBLICATIONS

Official Communication issued in International Patent Application No. PCT/JP2016/075885, mailed on Nov. 22, 2016.

Primary Examiner — Derek J Rosenau
(74) Attorney, Agent, or Firm — Keating & Bennett, LLP

(57) ABSTRACT

An acoustic wave device includes a high acoustic velocity support substrate defining and functioning as a high acoustic velocity member, a low acoustic velocity film, a piezoelectric film, and an IDT electrode that are laminated in this order. When a wavelength of an acoustic wave determined by an electrode finger cycle of the IDT electrode is represented by λ, a film thickness of the piezoelectric film is about 1.5λ or more and about 3.5λ or less. The acoustic velocity of a bulk wave propagating in the high acoustic velocity support substrate is higher than the acoustic velocity of an acoustic wave propagating in the piezoelectric film. The acoustic velocity of a bulk wave propagating in the low acoustic velocity film is lower than the acoustic velocity of an acoustic wave propagating in the piezoelectric film.

9 Claims, 9 Drawing Sheets

(58) Field of Classification Search
USPC ...... 310/313 R, 313 A, 313 B, 313 C, 313 D
See application file for complete search history.

(56) References Cited

U.S. PATENT DOCUMENTS

| | | |
|---|---|---|
| 2008/0150652 A1 | 6/2008 | Itou |
| 2008/0211602 A1* | 9/2008 | Khelif ................... H03H 3/04 |
| | | 333/193 |
| 2009/0045704 A1 | 2/2009 | Barber et al. |
| 2012/0194032 A1 | 8/2012 | Kadota |
| 2013/0285768 A1* | 10/2013 | Watanabe ................ H03H 3/02 |
| | | 333/193 |
| 2014/0130319 A1* | 5/2014 | Iwamoto ................ H03H 9/173 |
| | | 29/25.35 |
| 2014/0139075 A1* | 5/2014 | Iwamoto ................. H03H 3/04 |
| | | 310/364 |
| 2014/0152146 A1* | 6/2014 | Kimura ............... H01L 41/1873 |
| | | 310/313 B |
| 2016/0294361 A1 | 10/2016 | Yamane et al. |

FOREIGN PATENT DOCUMENTS

| | | |
|---|---|---|
| KR | 10-2008-0059530 A | 6/2008 |
| KR | 10-2010-0057803 A | 6/2010 |
| KR | 10-2012-0049401 A | 5/2012 |
| WO | 2011/046117 A1 | 4/2011 |
| WO | 2012/086639 A1 | 6/2012 |
| WO | 2015/098756 A1 | 7/2015 |

\* cited by examiner

ACOUSTIC WAVE DEVICE, HIGH-FREQUENCY FRONT END CIRCUIT, AND COMMUNICATION DEVICE

CROSS REFERENCE TO RELATED APPLICATIONS

This application claims the benefit of priority to Japanese Patent Application No. 2015-175941 filed on Sep. 7, 2015 and is a Continuation Application of PCT Application No. PCT/JP2016/075885 filed on Sep. 2, 2016. The entire contents of each application are hereby incorporated herein by reference.

BACKGROUND OF THE INVENTION

1. Field of the Invention

The present invention relates to an acoustic wave device to be used as a resonator or a bandpass filter, and a high-frequency front end circuit and a communication device, each of which includes the acoustic wave device.

2. Description of the Related Art

Heretofore, an acoustic wave device has been widely used as a resonator or a bandpass filter. WO2012/086639A1 discloses an acoustic wave device in which a low acoustic velocity film, a piezoelectric film, and an IDT electrode are laminated in this order on a high acoustic velocity support substrate. In WO2012/086639A1, an acoustic wave device in which a high acoustic velocity film, a low acoustic velocity film, a piezoelectric film, and an IDT electrode are laminated in this order on a support substrate is disclosed.

The acoustic velocity of a bulk wave propagating in the high acoustic velocity support substrate or the high acoustic velocity film is higher than the acoustic velocity of an acoustic wave propagating in the piezoelectric film. The acoustic velocity of a bulk wave propagating in the low acoustic velocity film is lower than the acoustic velocity of an acoustic wave propagating in the piezoelectric film.

According to the acoustic wave device disclosed in WO2012/086639A1, the Q factor is able to be increased when a laminate of the high acoustic velocity support substrate and the low acoustic velocity film or a laminate of the high acoustic velocity film and the low acoustic velocity film is used. However, the film thickness of the piezoelectric film used in this case was very small, such as $1.5\lambda$ or less. Thus, the variation in characteristics caused by the variation in film thickness of the piezoelectric film is disadvantageously increased.

SUMMARY OF THE INVENTION

Preferred embodiments of the present invention provide acoustic wave devices each having a high Q factor and a small variation in characteristics caused by the variation in film thickness of a piezoelectric film, and high-frequency front end circuits and communication devices each including such an acoustic wave device.

An acoustic wave device according to a preferred embodiment of the present invention includes a piezoelectric film; a high acoustic velocity member in which the acoustic velocity of a bulk wave propagating therein is higher than the acoustic velocity of an acoustic wave propagating in the piezoelectric film; a low acoustic velocity film in which the acoustic velocity of a bulk wave propagating therein is lower than the acoustic velocity of an acoustic wave propagating in the piezoelectric film and which is laminated on the high acoustic velocity member; the piezoelectric film being laminated on the low acoustic velocity film; and an IDT electrode provided on one surface of the piezoelectric film, and when a wavelength of an acoustic wave which is determined by an electrode finger cycle of the IDT electrode is represented by $\lambda$, a film thickness of the piezoelectric film is about $1.5\lambda$ or more and about $3.5\lambda$ or less.

In an acoustic wave device according to a preferred embodiment of the present invention, the high acoustic velocity member is a high acoustic velocity support substrate. In this case, the structure is able to be simplified, and the number of components is able to be reduced.

In an acoustic wave device according to a preferred embodiment of the present invention, a bonding layer provided at any position from the high acoustic velocity support substrate to the interface between the low acoustic velocity film and the piezoelectric film is further provided.

In an acoustic wave device according to a preferred embodiment of the present invention, the bonding layer is provided in the high acoustic velocity support substrate, at the interface between the high acoustic velocity support substrate and the low acoustic velocity film, in the low acoustic velocity film, or at the interface between the low acoustic velocity film and the piezoelectric film.

In an acoustic wave device according to a preferred embodiment of the present invention, the high acoustic velocity support substrate is a silicon substrate. In this case, since a silicon substrate has excellent processability, the acoustic wave device is able to be easily manufactured. In addition, the variation in characteristics is able to be further reduced. Furthermore, higher-order modes are able to be reduced or prevented.

In an acoustic wave device according to a preferred embodiment of the present invention, a support substrate is further provided, and the high acoustic velocity member is a high acoustic velocity film provided on the support substrate.

In an acoustic wave device according to a preferred embodiment of the present invention, a bonding layer provided at any position from in the high acoustic velocity film to the interface between the low acoustic velocity film and the piezoelectric film is further provided.

In an acoustic wave device according to a preferred embodiment of the present invention, the bonding layer is provided in the high acoustic velocity film, at the interface between the high acoustic velocity film and the low acoustic velocity film, in the low acoustic velocity film, or at the interface between the low acoustic velocity film and the piezoelectric film.

In an acoustic wave device according to a preferred embodiment of the present invention, the bonding layer includes a metal oxide layer or a metal nitride layer.

In an acoustic wave device according to a preferred embodiment of the present invention, the bonding layer includes a Ti layer, and the film thickness of the Ti layer is about 0.4 nm or more and about 2.0 nm or less.

In an acoustic wave device according to a preferred embodiment of the present invention, the film thickness of the Ti layer is about 0.4 nm or more and about 1.2 nm or less.

In an acoustic wave device according to a preferred embodiment of the present invention, the low acoustic velocity film is a film primarily including silicon oxide or silicon nitride. In this case, frequency-temperature characteristics are able to be improved.

In an acoustic wave device according to a preferred embodiment of the present invention, the piezoelectric film is made of LiTaO$_3$. In this case, an acoustic wave device having a higher Q factor is able to be provided.

In an acoustic wave device according to a preferred embodiment of the present invention, the low acoustic velocity film is made of silicon oxide, the bonding layer is provided at a position in the low acoustic velocity film, the low acoustic velocity film includes a first low acoustic velocity film layer located on the bonding layer at a piezoelectric film side and a second low acoustic velocity film layer located on the bonding layer at a side opposite to the piezoelectric film, and when the wavelength of an acoustic wave to be used by the acoustic wave device is represented by λ, the film thickness of the first low acoustic velocity film layer is about 0.12λ or more.

In an acoustic wave device according to a preferred embodiment of the present invention, the film thickness of the first low acoustic velocity film layer is about 0.22λ or more.

In an acoustic wave device according to a preferred embodiment of the present invention, an intermediate layer is provided between the high acoustic velocity film and the support substrate.

A high-frequency front end circuit according to a preferred embodiment of the present invention includes an acoustic wave device according to a preferred embodiment of the present invention, and a power amplifier.

A communication device according to a preferred embodiment of the present invention includes the high-frequency front end circuit described above, an RF signal processing circuit, and a baseband signal processing circuit.

In acoustic wave devices according to preferred embodiments of the present invention, the Q factor is high, and furthermore, the film thickness of the piezoelectric film preferably is about 1.5λ or more and about 3.5λ or less, so that the variation in characteristics caused by the variation in film thickness is not likely to be generated.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, with reference to the drawings, the present invention will be disclosed by describing particular preferred embodiments of the present invention.

In addition, the preferred embodiments of the present specification are each described by way of example, and between the different preferred embodiments, it is to be understood that partial replacement and/or combination between the structures may be performed.

Figure 1A:
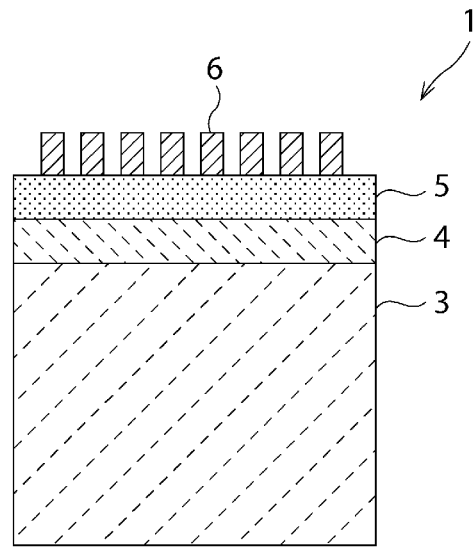
FIGS. 1A and 1B are a schematic front cross-sectional view of an acoustic wave device according to a first preferred embodiment of the present invention and a schematic plan view of an electrode structure, respectively.

FIG. 1A is a schematic front cross-sectional view of an acoustic wave device according to a first preferred embodiment of the present invention.

An acoustic wave device 1 includes a high acoustic velocity support substrate 3 defining and functioning as a high acoustic velocity member. On the high acoustic velocity support substrate 3, a low acoustic velocity film 4 having a relatively low acoustic velocity is laminated. In addition, a piezoelectric film 5 is laminated on the low acoustic velocity film 4. On an upper surface of this piezoelectric film 5, an IDT electrode 6 is laminated. Alternatively, on a lower surface of the piezoelectric film 5, the IDT electrode 6 may be laminated.

Since the low acoustic velocity film 4 is disposed between the high acoustic velocity member and the piezoelectric film 5, the acoustic velocity of an acoustic wave is decreased. Energy of an acoustic wave is intrinsically concentrated to a low acoustic velocity medium. Thus, an effect of confining acoustic wave energy in the piezoelectric film 5 and the IDT electrode 6 in which an acoustic wave is excited is able to be improved. As a result, compared to a case in which the low acoustic velocity film 4 is not provided, according to the present preferred embodiment, the loss is able to be reduced, and the Q factor is able to be increased.

In addition, the high acoustic velocity support substrate 3 confines an acoustic wave at a portion at which the piezoelectric film 5 and the low acoustic velocity film 4 are laminated to each other and does not to allow the acoustic wave to leak to the high acoustic velocity support substrate 3 and the structure located thereunder. That is, energy of an acoustic wave of a specific mode to be used to obtain the characteristics of a filter or a resonator is distributed over the entire piezoelectric film and the entire low acoustic velocity film, is also partially distributed in the high acoustic velocity support substrate 3 at a low acoustic velocity film 4 side thereof, and is not distributed at a lower side of the high acoustic velocity member. The mechanism by which an acoustic wave is confined by the high acoustic velocity support substrate 3 is a mechanism that is similar to that in the case of a Love wave surface wave which is a non-leaky SH wave and has been described, for example, in "Surface Acoustic Wave Device Simulation Technology Introduction", written by Kenya Hashimoto, Published by Realize Corporation, pp. 90 and 91. The mechanism described above is different from a mechanism in which confinement is performed using Bragg reflectors each defined by an acoustic multilayer film.

The high acoustic velocity support substrate 3 may preferably be made of an appropriate material which satisfies the following acoustic velocity relationship. As the material described above, for example, dielectric materials, such as various ceramics, including sapphire, alumina, magnesia, silicon nitride, aluminum nitride, silicon carbide, cordierite, mullite, steatite, and forsterite; semiconductors, such as silicon and gallium nitride; and resin substrates may preferably be used. In the present preferred embodiment, the high acoustic velocity support substrate 3 is preferably made of silicon, for example.

The high acoustic velocity support substrate 3 confines a surface acoustic wave at a portion at which the piezoelectric film 5 and the low acoustic velocity film 4 are laminated to each other and does not allow the surface acoustic wave to leak to the high acoustic velocity support substrate 3 and the structure located thereunder. In order to confine a surface acoustic wave at the portion at which the piezoelectric film 5 and the low acoustic velocity film 4 are laminated to each other, the high acoustic velocity support substrate 3 preferably has a larger film thickness.

In addition, in this specification, the high acoustic velocity member is a member in which the acoustic velocity of a bulk wave in the high acoustic velocity member is higher than the acoustic velocity of an acoustic wave, such as a surface wave or a boundary wave, propagating along the piezoelectric film. In addition, the low acoustic velocity film is a film in which the acoustic velocity of a bulk wave propagating in the low acoustic velocity film is lower than the acoustic velocity of an acoustic wave propagating in the piezoelectric film. In addition, although acoustic waves of various modes having different acoustic velocities are excited by the IDT electrode having a specific structure, the acoustic wave propagating in the piezoelectric film is an acoustic wave of a specific mode to be used to obtain the characteristics of a filter or a resonator. The mode of a bulk wave which determines the acoustic velocity of the bulk wave is defined in accordance with a usage mode of an acoustic wave propagating in the piezoelectric film. When the high acoustic velocity member and the low acoustic velocity film are isotropic with respect to a bulk wave propagation direction, the correspondence is as shown in Table 1. That is, with the mode of a bulk wave in the right column of the following Table 1 corresponding to the main mode of an acoustic wave in the left column of the following Table 1, the high acoustic velocity and the low acoustic velocity are determined. A P wave is a longitudinal wave, and an S wave is a transverse wave.

In addition, in the following Table 1, U1 represents an acoustic wave including a P wave as a primary component, U2 represents an acoustic wave including an SH wave as a primary component, and U3 represents an acoustic wave including an SV wave as a primary component.

TABLE 1

CORRESPONDENCE BETWEEN ACOUSTIC WAVE MODE
OF PIEZOELECTRIC FILM AND BULK WAVE MODE
OF DIELECTRIC FILM
(THE CASE IN WHICH THE DIELECTRIC FILM IS
AN ISOTROPIC MATERIAL)

| MAIN MODE OF ACOUSTIC WAVE PROPAGATING IN PIEZOELECTRIC FILM | MODE OF BULK WAVE PROPAGATING IN DIELECTRIC FILM |
|---|---|
| U1 | P WAVE |
| U2 | S WAVE |
| U3 + U1 | S WAVE |

When the low acoustic velocity film 4 and the high acoustic velocity support substrate 3 are anisotropic in propagation property of a bulk wave, as shown in the following Table 2, the modes of bulk waves which determine a high acoustic velocity and a low acoustic velocity are determined. In addition, among the modes of bulk waves, an SH wave or an SV wave, whichever is slower, is denoted as a slow transverse wave and, whichever is faster, is denoted as a fast transverse wave. A slower transverse wave to be selected from the above two types of waves is determined depending on the anisotropic property of the material. In $LiTaO_3$ or $LiNbO_3$ in the vicinity of rotated Y-cut, among bulk waves, an SV wave is a slow transverse wave, and an SH wave is a fast transverse wave.

TABLE 2

CORRESPONDENCE BETWEEN ACOUSTIC WAVE MODE
OF PIEZOELECTRIC FILM AND BULK WAVE MODE
OF DIELECTRIC FILM
(THE CASE IN WHICH THE DIELECTRIC FILM IS AN
ANISOTROPIC MATERIAL)

| MAIN MODE OF ACOUSTIC WAVE PROPAGATING IN PIEZOELECTRIC FILM | MODE OF BULK WAVE PROPAGATING IN DIELECTRIC FILM |
|---|---|
| U1 | P WAVE |
| U2 | SH WAVE |
| U3 + U1 | SV WAVE |

In the present preferred embodiment, the low acoustic velocity film 4 is preferably made of silicon oxide, and although the film thickness thereof is not particularly limited, when the wavelength of an acoustic wave determined by the electrode finger cycle of the IDT electrode is represented by λ, the film thickness is preferably about 2.0λ or less, for example. Since the film thickness of the low acoustic velocity film preferably is set to about 2.0λ or less, for example, a film stress is able to be reduced, and as a result, the warpage of a wafer is able to be reduced, so that improvement in yield and stabilization in characteristics are achieved.

As a material for the low acoustic velocity film 4, an appropriate material having a bulk wave acoustic velocity lower that the acoustic velocity of an acoustic wave propagating in the piezoelectric film 5 may preferably be used. As the material described above, for example, a medium including as a primary component, silicon oxide, glass, silicon oxynitride, tantalum oxide, or a compound formed by adding at least one of fluorine, carbon, and boron to silicon oxide may preferably be used.

As materials of the low acoustic velocity film and the high acoustic velocity support substrate, as long as the above acoustic velocity relationship is satisfied, any appropriate materials may be used.

The piezoelectric film 5 is preferably made of a 50.0° Y-cut $LiTaO_3$, that is, a $LiTaO_3$ having Euler angles (0°, 140.0°, 0°), for example. When the wavelength of a surface acoustic wave determined by the electrode finger cycle of the IDT electrode 6 is represented by $\lambda$, the film thickness of the piezoelectric film 5 is preferably in a range of from about 1.5$\lambda$ or more to about 3.5$\lambda$ or less, and in this preferred embodiment, the film thickness is more preferably set to about 2.0$\lambda$, for example. In addition, the piezoelectric film 5 may be made of a $LiTaO_3$ having another cut angle or a piezoelectric single crystal other than $LiTaO_3$. Since a piezoelectric single crystal is used, the loss of a material itself is able to be reduced, and the characteristics of a device are able to be improved.

In the present preferred embodiment, the IDT electrode 6 is preferably made of Al. In addition, the IDT electrode 6 may also be made of, for example, an appropriate metal material, such as Al, Cu, Pt, Au, Ag, Ti, Ni, Cr, Mo, W or an alloy including as a primary component, at least one of the metals mentioned above. In addition, the IDT electrode 6 may also have the structure in which metal films formed from those metals or alloys are laminated to each other.

Figure 1B:
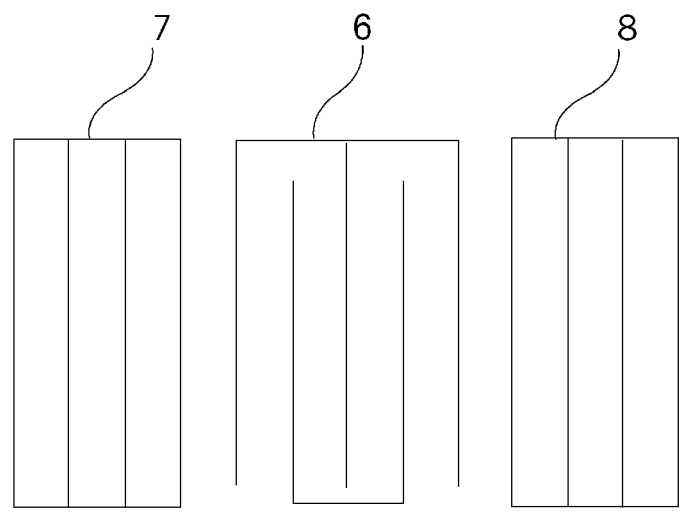

Although schematically shown in FIG. 1A, an electrode structure shown in FIG. 1B is provided on the piezoelectric film 5. That is, the IDT electrode 6 and the reflectors 7 and 8 disposed at two sides thereof in an acoustic wave propagation direction are provided. Accordingly, a one-port type acoustic wave resonator is provided. In addition, the electrode structure including the IDT electrode is not particularly limited, and modifications may be made so as to provide an appropriate resonator, or a ladder filter in which resonators are used in combination, a vertically coupled filter, a lattice type filter, or a transversal type filter, for example.

In the acoustic wave device 1, since the high acoustic velocity support substrate 3, the low acoustic velocity film 4, and the piezoelectric film 5 are laminated to each other, as is the case of the acoustic wave device described in WO2012/086639A1, the Q factor is able to be increased. In particular, since the thickness of the piezoelectric film 5 preferably is set in a range of from about 1.5$\lambda$ or more to about 3.5$\lambda$ or less, for example, the Q factor is not only increased, but also the variation in characteristics caused by the variation in film thickness of the piezoelectric film 5 is reduced. Those described above will be explained with reference to FIGS. 2 to 4.

Figure 2:
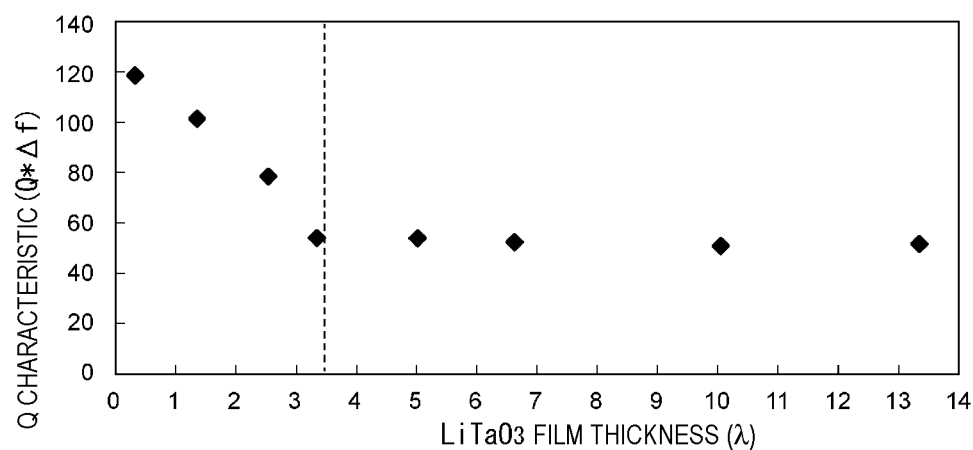
FIG. 2 is a graph showing the relationship between Q and the film thickness of a LiTaO$_3$ film of the acoustic wave device.
Figure 3:
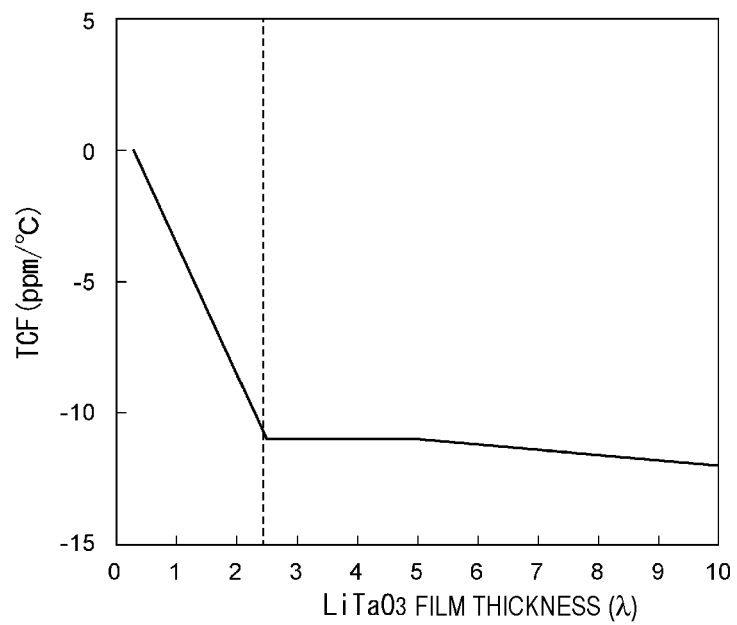
FIG. 3 is a graph showing the relationship between the film thickness of the LiTaO$_3$ film of the acoustic wave device and a temperature coefficient of frequency TCF.
Figure 4:
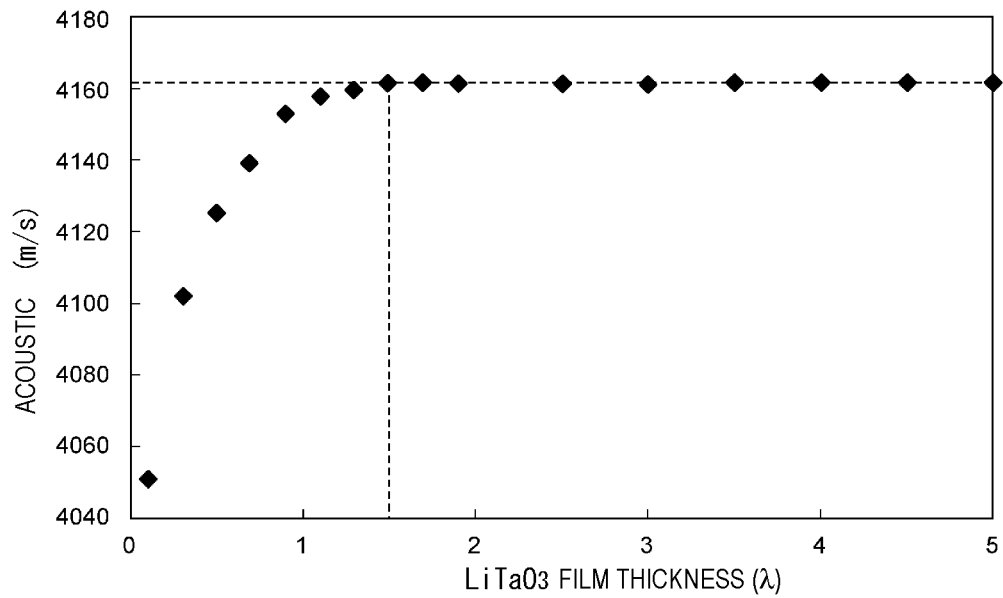
FIG. 4 is a graph showing the relationship between the film thickness of the LiTaO$_3$ film of the acoustic wave device and the acoustic velocity.

FIG. 2 is a graph showing the relationship between the Q factor and the film thickness of $LiTaO_3$ of an acoustic wave device in which a low acoustic velocity film 4 made of a $SiO_2$ film having a thickness of about 0.35$\lambda$ and a piezoelectric film 5 made of a $LiTaO_3$ having Euler angels (0°, 140.0°, 0°) are laminated on a high acoustic velocity support substrate 3 made of silicone, for example. In this case, the vertical axis in FIG. 2 represents the product of a Q characteristic of a resonator and a fractional bandwidth ($\Delta f$), and this product has been used as one index to judge whether the device performance is good or not. In addition, FIG. 3 is a graph showing the relationship between the film thickness of $LiTaO_3$ and a temperature coefficient of frequency (TCF). FIG. 4 is a graph showing the relationship between the film thickness of $LiTaO_3$ and the acoustic velocity. As is apparent from FIG. 2, when the film thickness of $LiTaO_3$ is about 3.5$\lambda$ or less, it was discovered that compared to the case in which the film thickness is more than about 3.5$\lambda$, the Q factor is increased, and the Q characteristic is improved. In addition, in order to increase the Q factor, the film thickness of $LiTaO_3$ is more preferably about 2.5$\lambda$ or less, for example.

In addition, from FIG. 3, when the film thickness of $LiTaO_3$ is about 2.5$\lambda$ or less, it was discovered that compared to the case in which the film thickness is more than about 2.5$\lambda$, the absolute value of the temperature coefficient of frequency TCF is decreased. In addition, in the range of about 2$\lambda$ or less, it is more preferable since the absolute value of the temperature coefficient of frequency TCF is able to be set to about 10 ppm/° C. or less, for example.

As is apparent from FIG. 4, when the film thickness of $LiTaO_3$ is more than about 1.5$\lambda$, it was discovered that the change in acoustic velocity caused by the change in film thickness of $LiTaO_3$ is significantly reduced. Accordingly, since the frequency dependence by the film thickness of $LiTaO_3$ is significantly reduced, it was discovered that the variation in frequency-temperature characteristics caused by the change in film thickness is significantly reduced.

In addition, in the acoustic wave device 1 according to the present preferred embodiment, the high acoustic velocity support substrate 3 is preferably made of silicon, for example. The high acoustic velocity support substrate 3 made of silicon has preferable processability. Furthermore, higher-order modes are able to be effectively reduced or prevented.

In addition, since the low acoustic velocity film 4 is preferably made of $SiO_2$, for example, the absolute value of the temperature coefficient of frequency TCF is decreased.

Since $LiTaO_3$ is preferably used as the piezoelectric film 5, and the film thickness of the piezoelectric film 5 is preferably set in the specific range described above, even when the film thickness of the piezoelectric film 5 is varied, the Q factor is sufficiently high, and furthermore, the variation in characteristics is reduced.

At least one boundary among the piezoelectric film, the low acoustic velocity film, and the high acoustic velocity support substrate, at least one layer selected from an adhesive layer, an underlayer, a low acoustic velocity layer, and a high acoustic velocity layer may preferably be provided.

Figure 5:
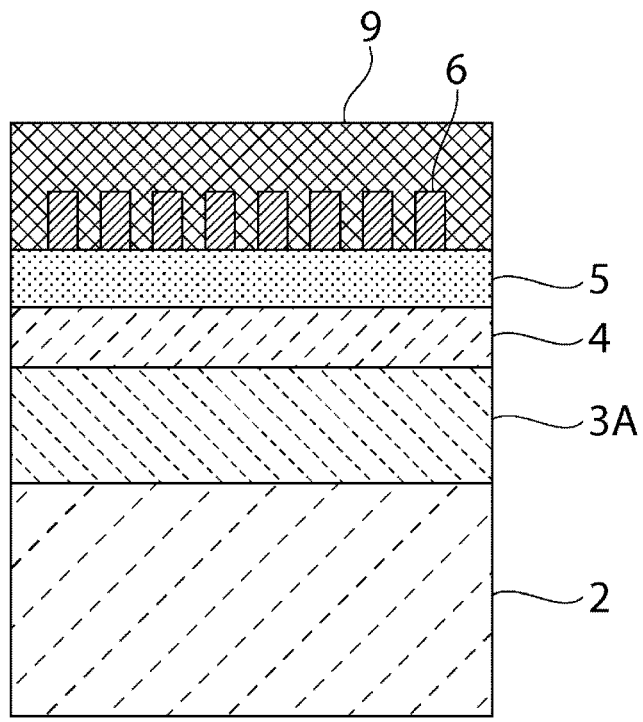
FIG. 5 is a schematic front cross-sectional view of an acoustic wave device according to a second preferred embodiment of the present invention.

In addition, in the present preferred embodiment, although the low acoustic velocity film 4, the piezoelectric film 5, and the IDT electrode 6 are laminated in this order on the high acoustic velocity support substrate 3, as in a second preferred embodiment shown in FIG. 5, a high acoustic velocity film 3A defining and functioning as the high acoustic velocity member may preferably be laminated on a support substrate 2. As the support substrate 2 in this case, appropriate materials, such as silicon, alumina, piezoelectric materials including lithium tantalate, lithium niobate, and quartz; various ceramics, such as zirconia; and dielectric materials, such as glass, for example, may preferably be used.

Also in the second preferred embodiment, as is the case in the first preferred embodiment, since the film thickness of a piezoelectric film 5 is preferably set to about 1.5$\lambda$ or more and about 3.5$\lambda$ or less, for example, the Q factor is high, and the variation in characteristics caused by the variation in film thickness of the piezoelectric film 5 is reduced. The inventors of preferred embodiments of the present invention confirmed that the region in which the Q characteristic is improved, the region in which TCF is improved, and the region in which the frequency is stabilized in the first preferred embodiment are the same or substantially the same as those in the second preferred embodiment. Thus, the results of the first preferred embodiment shown in FIGS. 2 to 4 are also considered to be the same as or similar to those of the second preferred embodiment.

In the second preferred embodiment, the high acoustic velocity film 3A confines an acoustic wave, and a main vibration mode is not allowed to leak to the support substrate. That is, as long as the support substrate is able to support the film structure, a material having any acoustic velocity may be used therefor. That is, the degree of freedom in selecting the material of the support substrate is increased.

In addition, although a bonding layer may be provided in some cases to form the acoustic wave device according to each of the first and the second preferred embodiments, in the case of the first preferred embodiment, the bonding layer is disposed in the region in which the main mode is excited. Thus, the variation in characteristics may be produced thereby. On the other hand, in the case of the second preferred embodiment, when being disposed in the high acoustic velocity film or at a support substrate side, the bonding layer may preferably be disposed at a position to which the main mode does not reach. Thus, in the second preferred embodiment, the variation in characteristics is not likely to be produced.

In addition, between the high acoustic velocity film 3A and the support substrate 2, a dielectric film may preferably be provided. For example, since a low acoustic velocity film is disposed between the high acoustic velocity film 3A and the support substrate 2, without changing the main vibration mode, unnecessary higher-order modes are able to be extracted only to the support substrate side. Thus, in the second preferred embodiment, higher-order modes are more easily reduced or prevented.

Figure 6:
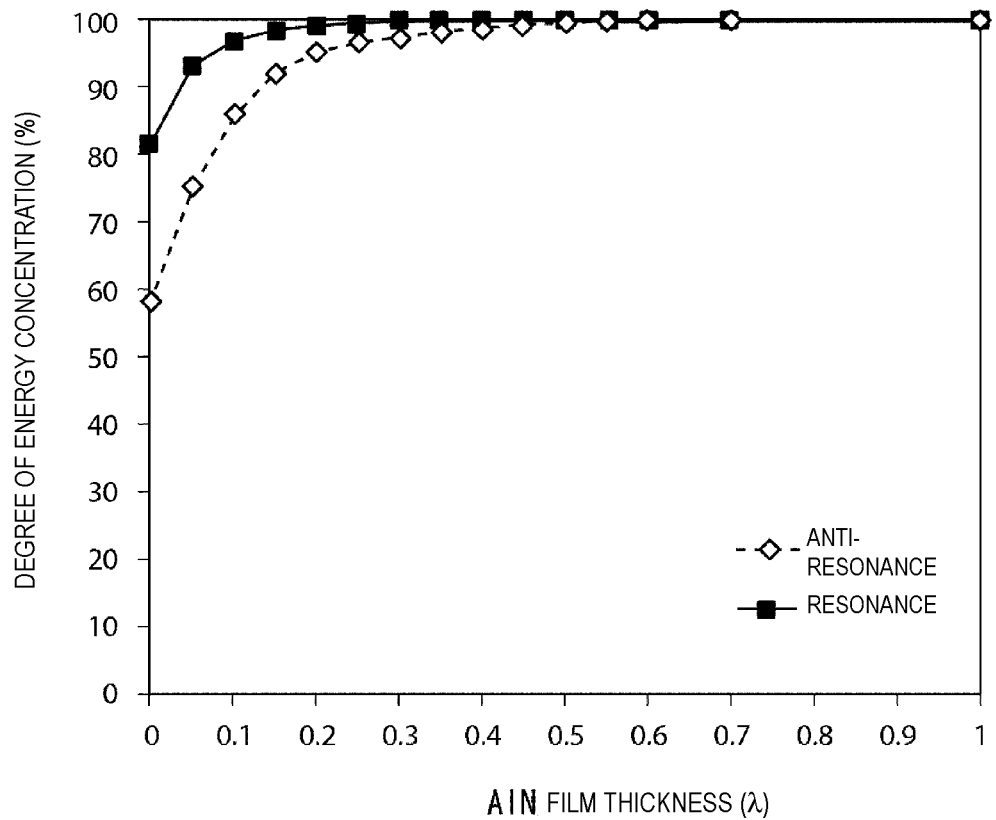
FIG. 6 is a graph showing the relationship between the film thickness of a high acoustic velocity film of the acoustic wave device and the degree of energy concentration.

In addition, the high acoustic velocity film 3A confines a surface acoustic wave in the piezoelectric film 5 and the low acoustic velocity film 4, and the high acoustic velocity film 3A preferably has a relatively large film thickness. As shown in FIG. 6, since the film thickness of a high acoustic velocity film made of an AlN film is set to about 0.3λ or more, for example, the degree of energy concentration at a resonant point is able to be set to 100%, and when the film thickness described above is set to about 0.5λ or more, for example, the degree of energy concentration at an anti-resonant point is also able to be set to 100%, so that more preferable device performance is obtained.

At at least one boundary among the piezoelectric film, the low acoustic velocity film, the high acoustic velocity film, and the support substrate, at least one layer selected from an adhesive layer, an underlayer, a low acoustic velocity layer, and a high acoustic velocity layer may preferably be provided.

Furthermore, in the second preferred embodiment, a dielectric film 9 is laminated so as to cover an IDT electrode 6. As this dielectric film 9, for example, $SiO_2$ or SiN may be used. $SiO_2$ is preferably used, and in this case, the absolute value of the temperature coefficient of frequency TCF is able to be further decreased. In addition, also in the first preferred embodiment, the dielectric film 9 may preferably be provided.

As described above, the bonding layer may preferably be used to form the acoustic wave device according to each of the first and the second preferred embodiments. The structure including the bonding layer as described above will be described using acoustic wave devices according to the following third to eighth preferred embodiments of the present invention by way of example.

Figure 7:
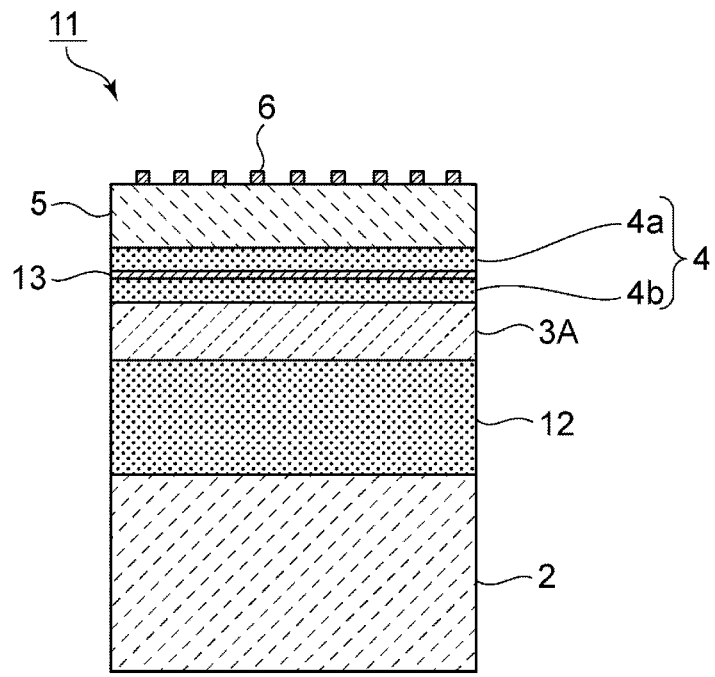
FIG. 7 is a schematic front cross-sectional view of an acoustic wave device according to a third preferred embodiment of the present invention.

FIG. 7 is a schematic front cross-sectional view of an acoustic wave device according to a third preferred embodiment of the present invention. In an acoustic wave device 11 according to the third preferred embodiment, a first silicon oxide film 12 is laminated on a support substrate 2. On the first silicon oxide film 12, a high acoustic velocity film 3A is laminated. On the high acoustic velocity film 3A, a second silicon oxide film defining and functioning as a low acoustic velocity film 4 is laminated. The low acoustic velocity film 4 includes a low acoustic velocity film layer 4a and a low acoustic velocity film layer 4b that are bonded to each other with a bonding layer 13 interposed therebetween. On the low acoustic velocity film 4, a piezoelectric film 5 is laminated. As described above, except that the first silicon oxide film 12 defining and functioning as an intermediate layer is provided, the low acoustic velocity film 4 includes the low acoustic velocity film layers 4a and 4b, and the bonding layer 13 is provided, the acoustic wave device 11 is substantially the same as or similar to the acoustic wave device according to the second preferred embodiment.

In the acoustic wave device 11, in order to confine an acoustic wave at a portion at which the piezoelectric film 5 and the low acoustic velocity film 4 are laminate to each other, the high acoustic velocity film 3A preferably has a larger film thickness. Thus, when the wavelength of a surface acoustic wave is represented by λ, the film thickness of the high acoustic velocity film is preferably about 0.5 times or more of λ and more preferably about 1.5 times or more thereof, for example. As is apparent from a manufacturing method which will be described later, the bonding layer 13 is preferably a portion defined by metal diffusion bonding and is a Ti oxide in the preferred embodiment.

In addition, besides Ti, another metal may also be used. As the metal described above, for example, Al may be used. In addition, the bonding layer 13 may be defined by a metal, such as Ti or Al, instead of using a metal oxide. In addition, since electrical insulation is able to be obtained, a metal oxide or a metal nitride, for example, is preferable. In particular, since having a high bonding force is preferable, an oxide or a nitride of Ti is preferably used.

In the acoustic wave device 11 according to the present preferred embodiment, since the low acoustic velocity film 4 is laminated on the high acoustic velocity film 3A, and the piezoelectric film 5 is laminated on the low acoustic velocity film 4, as is the case of the acoustic wave device described in WO2012/086639A1, the Q factor is able to be increased. In addition, in the present preferred embodiment, since the bonding layer 13 defined by metal diffusion is located in the low acoustic velocity film 4, during manufacturing, the warpage is not likely to be generated at a mother wafer stage. Thus, even in the finally obtained acoustic wave device 11, the warpage of the piezoelectric film 5 and other layers is not likely to be generated. Therefore, the characteristics are not likely to be degraded. In addition, for example, in a wafer transportation step in the manufacturing and in transportation of final products, cracks are not likely to be generated in the piezoelectric film 5, the support substrate 2, and other layers. The reason for this will be described in more detail by explaining the following non-limiting example of a manufacturing method.

In the manufacturing of the acoustic wave device 11, the first silicon oxide film 12 and the high acoustic velocity film 3A are laminated on the support substrate 2. Subsequently, in order to form the low acoustic velocity film 4, the second silicon oxide film is laminated on the high acoustic velocity film 3A to obtain a first laminate. By a separate process, a second laminate in which an IDT electrode is formed on one surface of the piezoelectric film and a silicon oxide film is formed on a surface opposite thereto is prepared.

In addition, on the surface of the silicon oxide film of the first laminate and the surface of the silicon oxide film of the second laminate, Ti layers are respectively laminated. Next, the Ti layers of the first and the second laminates are brought into contact with each other and are then bonded to each other by heating. In this case, Ti metals of the two bonded layers are diffused into each other. As a result, by metal diffusion bonding, the bonding layer 13 is formed. In addition, oxygen is supplied from a silicon oxide film side to the Ti layer. Thus, this bonding layer 13 is formed from a Ti oxide. Accordingly, a sufficient electrical resistance is not only obtained, but also the first laminate and the second laminate are securely bonded to each other.

The obtained laminate is cut into individual acoustic wave devices 11 units. As a result, the acoustic wave devices 11 are obtained.

In the present preferred embodiment, since the bonding layer 13 described above is located in the low acoustic velocity film 4, at the stage at which the laminate including the first laminate and the second laminate bonded thereto is obtained, the warpage is not likely to be generated.

The inventors of preferred embodiments of the present invention discovered that when the acoustic wave device described in WO2012/086639A1 is obtained by bonding using metal diffusion bonding, in a laminate including a first and a second laminate bonded to each other, the warpage was generated in the piezoelectric film. In addition, in the acoustic wave device obtained by cutting of the warped laminate, a ripple in electrical characteristics, such as resonant characteristics, was generated in some cases. On the other hand, after the bonding is performed, for example, by press molding under heating conditions, the warpage may be overcome. However, even when the processing was performed in order to overcome the warpage, the degradation in electrical characteristics could not be prevented or recovered. Thus, it is believed that as a result of the warpage, microcracks and other defects are generated in the piezoelectric film.

Through further intensive research performed by the inventors of preferred embodiments of the present invention on the warpage, it was discovered that when the structures of the first and the second laminates were selected so that the bonding layer 13 was provided in the low acoustic velocity film 4 as in the case of the present preferred embodiment, the warpage described above could be effectively reduced or prevented.

According to WO2012/086639A1, a laminate structure including the piezoelectric film, the low acoustic velocity film, and the high acoustic velocity film and a laminate structure including a medium layer and the support substrate were bonded to each other. Thus, a large film stress was applied to the piezoelectric film which was not yet bonded. Accordingly, at the laminating stage at which the first and the second laminates were bonded to each other, a relatively large warpage was likely to be generated in the piezoelectric film.

On the other hand, in the present preferred embodiment, since the second laminate is formed only by laminating the silicon oxide film on the piezoelectric film, a large film stress is not applied to the piezoelectric film. Thus, even in the laminate obtained by bonding, the stress applied to the piezoelectric film 5 is relatively small, and the warpage is not likely to be generated. Accordingly, unlike the case described above regarding WO2012/086639A1, the degradation in electrical characteristics is not likely to be generated. In addition, cracks are also not likely to be generated. Those points will be described with reference to particular experimental examples.

As an example of the acoustic wave device 11, a one-port type acoustic wave resonator was formed. In addition, the number of pairs of electrode fingers of an IDT electrode was set to 100 pairs, the intersection width between the electrode fingers was set to about 20λ, and the wavelength determined by the pitch between the electrode fingers was set to about 2.0 μm. As for a reflector, the number of electrode fingers was set to 20. The IDT electrode 6 and the reflectors were each made of a metal including Al, and the thickness thereof was set to about 160 nm.

Figure 8:
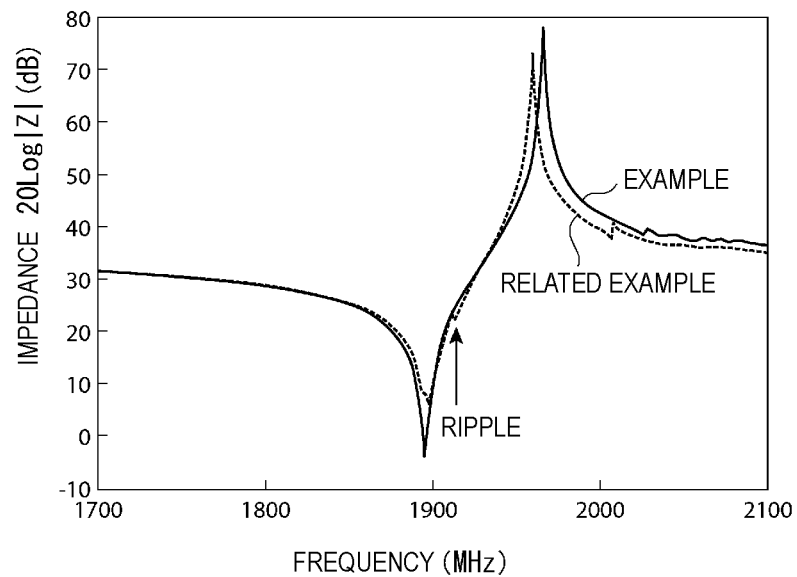
FIG. 8 is a graph showing the impedance characteristics of the acoustic wave device according to the third preferred embodiment of the present invention and those of an acoustic wave device of a related example.

In FIG. 8, resonant characteristics of an example of the third preferred embodiment are shown by a solid line. In addition, for comparison, except that the bonding layer 13 was provided in the first silicon oxide film 12, an acoustic wave device was formed in a manner similar to that in the example of the above-described preferred embodiment. The resonant characteristics of the acoustic wave device of this related example are shown in FIG. 8 by a dotted line. As is apparent from FIG. 8, in the related example, a ripple is generated between the resonant point and the anti-resonant point. On the other hand, according to the example, it was discovered that between the resonant point and the anti-resonant point, the ripple as described above is not generated. In addition, it was also discovered that the waveform at the resonant point is sharp as compared to that of the related example, and that the peak to valley ratio of the impedance characteristics is also increased.

As described above, the reason that the resonant characteristics of the example are improved as compared to those of the related example is believed to be that microcracks caused by the warpage as described above are not generated.

Figure 9:
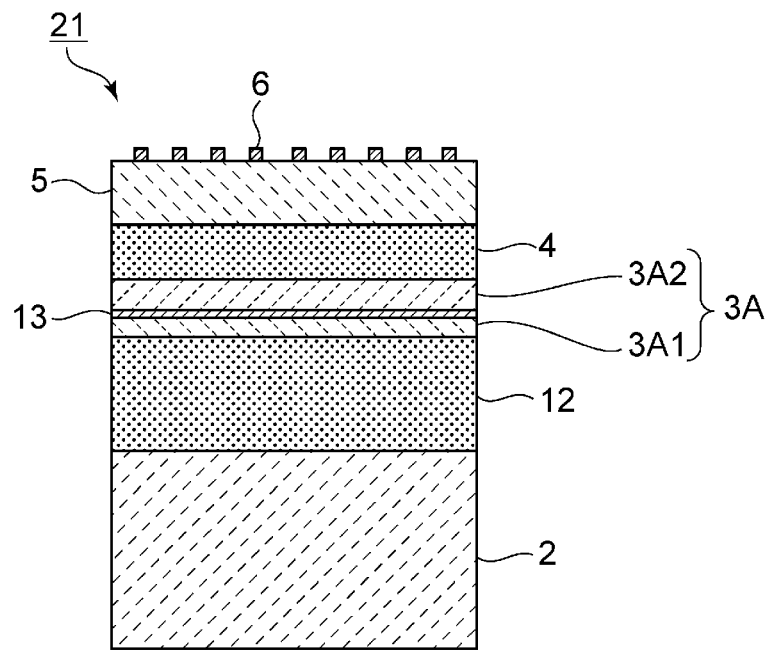
FIG. 9 is a schematic front cross-sectional view of an acoustic wave device according to a fourth preferred embodiment of the present invention.

FIG. 9 is a schematic front cross-sectional view of the acoustic wave device according to the fourth preferred embodiment of the present invention.

In an acoustic wave device 21 according to a fourth preferred embodiment of the present invention, a first silicon oxide film 12, a high acoustic velocity film 3A, a low acoustic velocity film 4, a piezoelectric film 5, and an IDT electrode 6 are laminated on a support substrate 2. In the acoustic wave device 21 of the fourth preferred embodiment, a bonding layer 13 is provided in the high acoustic velocity film 3A. That is, the high acoustic velocity film 3A includes high acoustic velocity film layers 3A1 and 3A2, and between the high acoustic velocity film layer 3A1 and the high acoustic velocity film layer 3A2, the bonding layer 13 is provided.

Also in the present preferred embodiment, in the manufacturing thereof, a second laminate in which the low acoustic velocity film and the high acoustic velocity film layer are provided on the piezoelectric film may be prepared. Thus, in the piezoelectric film, the warpage is not likely to be generated. Accordingly, as in the case of the first preferred embodiment, the degradation in electrical characteristics is also not likely to be generated in the acoustic wave device 21. In addition, cracks are not likely to be generated at a wafer stage and in the piezoelectric film of the acoustic wave device 21 obtained at a final stage.

Figure 10:
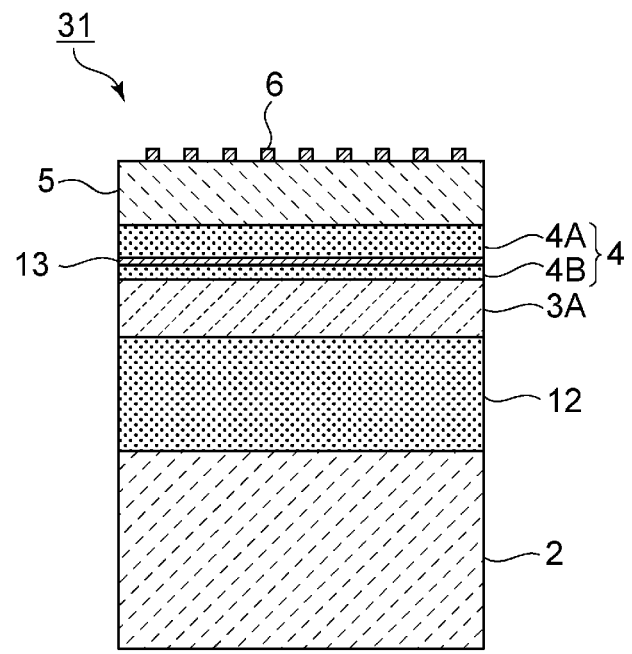
FIG. 10 is a schematic front cross-sectional view of an acoustic wave device according to a fifth preferred embodiment of the present invention.

FIG. 10 is a schematic front cross-sectional view of the acoustic wave device according to a fifth preferred embodiment of the present invention.

In an acoustic wave device 31 according to the fifth preferred embodiment, a first silicon oxide film 12, a high acoustic velocity film 3A, a second silicon oxide film 4B, a bonding layer 13, a third silicon oxide film 4A, a piezoelectric film 5, and an IDT electrode 6 are laminated in this order on a support substrate 2. In this case, the second silicon oxide film 4B and the third silicon oxide film 4A are each a low acoustic velocity film. In the present preferred embodiment, the bonding layer 13 is provided at the interface between the second silicon oxide film 4B and the third silicon oxide film 4A each of which defines and functions as a low acoustic velocity film.

Also in the present preferred embodiment, in the manufacturing thereof, a second laminate in which the third silicon oxide film 4A is provided on the piezoelectric film may be prepared. Thus, in the piezoelectric film, the warpage is not likely to be generated. Accordingly, also in the acoustic wave device 31, the degradation in electrical characteristics is not likely to be generated. In addition, cracks are also not likely to be generated at a wafer stage and in the piezoelectric film of the acoustic wave device 31 obtained at a final stage.

Figure 11:
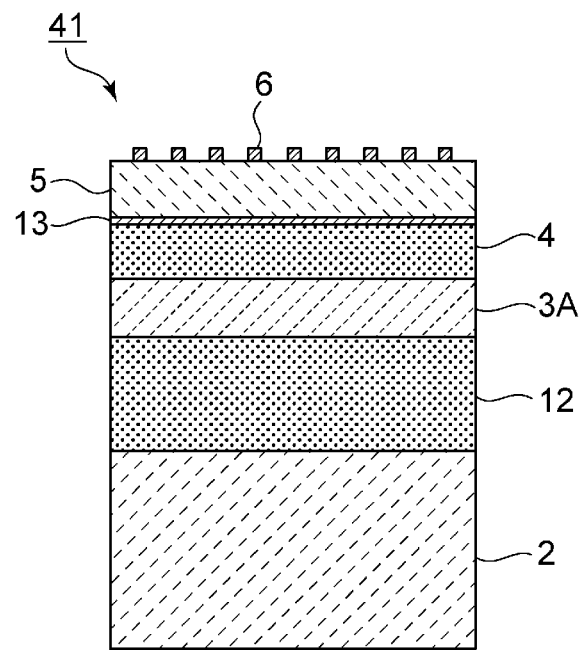
FIG. 11 is a schematic front cross-sectional view of an acoustic wave device according to a sixth preferred embodiment of the present invention.

FIG. 11 is a schematic front cross-sectional view of the acoustic wave device according to a sixth preferred embodiment of the present invention.

In an acoustic wave device 41 according to the sixth preferred embodiment, a first silicon oxide film 12, a high acoustic velocity film 3A, a low acoustic velocity film 4, a piezoelectric film 5, and an IDT electrode 6 are laminated on a support substrate 2. A bonding layer 13 is located at the interface between the low acoustic velocity film 4 and the piezoelectric film 5.

Also in the present preferred embodiment, in the manufacturing thereof, a second laminate in which the IDT electrode is laminated on the piezoelectric film may be prepared. Thus, in the piezoelectric film, the warpage is not likely to be generated. Accordingly, also in the acoustic wave device 41, the degradation in electrical characteristics is not likely to be generated. In addition, cracks are also not likely to be generated at a wafer stage or in the piezoelectric film of the acoustic wave device 41 obtained at a final stage.

As shown in the acoustic wave devices according to the third to the sixth preferred embodiments, the bonding layer 13 may be provided at any location from in the high acoustic velocity film 3A to the interface between the low acoustic velocity film 4 and the piezoelectric film 5.

Figure 12:
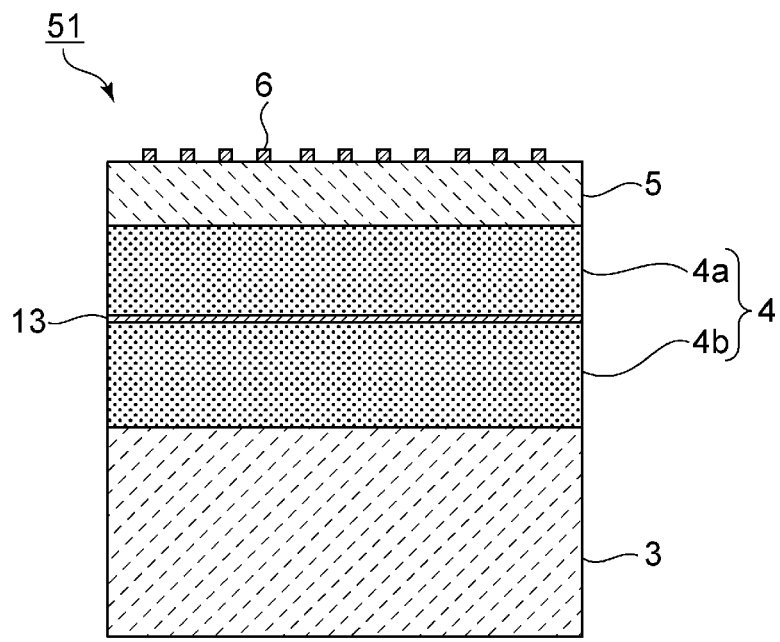
FIG. 12 is a schematic front cross-sectional view of an acoustic wave device according to a seventh preferred embodiment of the present invention.

FIG. 12 is a schematic front cross-sectional view of an acoustic wave device according to a seventh preferred embodiment of the present invention.

In an acoustic wave device 51, a low acoustic velocity film 4 is laminated on a high acoustic velocity support substrate 3. A piezoelectric film 5 is laminated on the low acoustic velocity film 4. An IDT electrode 6 is provided on the piezoelectric film 5. Although not particularly shown in the figure, reflectors are provided at two sides of the IDT electrode 6 in an acoustic wave propagation direction, and thus, a one-port type acoustic wave resonator is provided.

A bonding layer 13 is located in the low acoustic velocity film 4 preferably made from silicon oxide. That is, the bonding layer 13 is provided at the interface between a first low acoustic velocity film layer 4a and a second low acoustic velocity film layer 4b. Thus, in the manufacturing thereof, a second laminate in which the IDT electrode 6 and the first low acoustic velocity film layer 4a are laminated on the piezoelectric film 5 may be prepared. Accordingly, in the second laminate, a large film stress is not likely to be applied to the piezoelectric film 5. Thus, the warpage is not likely to be generated in the piezoelectric film.

In the manufacturing thereof, a metal layer, such as Ti or Al, for example, is preferably formed on an exposed surface of the low acoustic velocity film layer of the above second laminate. Subsequently, a first laminate in which a low acoustic velocity film layer is laminated on a mother high acoustic velocity support substrate is prepared. A metal layer of Ti or other suitable metal is formed on the low acoustic velocity film layer of this first laminate. Subsequently, the metal layers of the first laminate and the second laminate are brought into contact with each other and are then bonded to each other by heating. As described above, as in the acoustic wave device 11 according to the third preferred embodiment, the bonding layer 13 is formed.

Next, the obtained laminate is cut, so that individual acoustic wave devices 51 are obtained.

Also in the present preferred embodiment, since the bonding layer 13 is provided at the location described above, in the manufacturing thereof, the warpage is not likely to be generated at a piezoelectric film stage. Thus, the degradation in electrical characteristics is not likely to be generated. In addition, cracks and/or microcracks are not likely to be generated in the piezoelectric film 5 at a second laminate stage or in transportation of final products.

Figure 13:
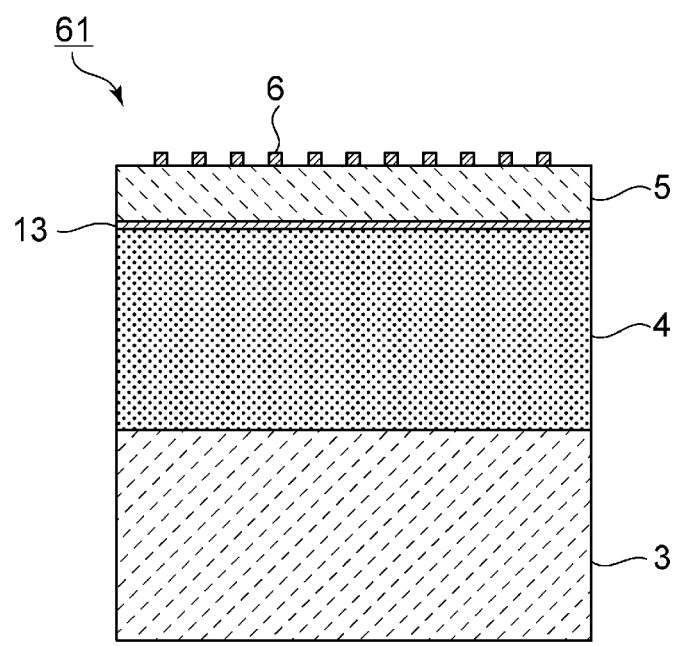
FIG. 13 is a schematic front cross-sectional view of an acoustic wave device according to an eighth preferred embodiment of the present invention.

FIG. 13 is a schematic front cross-sectional view of the acoustic wave device according to an eighth preferred embodiment of the present invention. In an acoustic wave device 61, a bonding layer 13 is located at the interface between a piezoelectric film 5 and a low acoustic velocity film 4. The other aspects of the acoustic wave device 61 are the same or substantially the same as those of the acoustic wave device 51.

Also in the acoustic wave device 61, the bonding layer 13 is located at a location close to a piezoelectric film 5 side. Thus, at a second laminate stage before bonding, the warpage is not likely to be generated in the piezoelectric film 5. Accordingly, as in the case of the acoustic wave device 51 according to the seventh preferred embodiment, the degradation in electrical characteristics is not likely to be generated. In addition, since the warpage of the piezoelectric film 5 is not likely to be generated in a manufacturing process, cracks and/or microcracks are also not likely to be generated. In addition, since the warpage is also not likely to be generated in the piezoelectric film 5, for example, in transportation of final products, cracks and/or microcracks are not likely to be generated.

Also in the structure including the high acoustic velocity support substrate 3 as is the case of each of the acoustic wave devices 51 and 61, another intermediate layer may preferably be provided between the high acoustic velocity support substrate 3 and the low acoustic velocity film 4. That is, the low acoustic velocity film 4 may be laminated indirectly on a high acoustic velocity support substrate 3. That is, in the structure including the high acoustic velocity support substrate 3, the bonding layer 13 may be located in the low acoustic velocity film 4 or at the interface between the piezoelectric film 5 and the low acoustic velocity film 4.

The relationship between the film thickness of the low acoustic velocity film and the Q factor will be described below.

In the acoustic wave device 51 according to the seventh preferred embodiment shown in FIG. 12, the film thickness of the first low acoustic velocity film layer 4a was changed, and various acoustic wave devices were provided. More particularly, a high acoustic velocity support substrate 3 made of Si was used. As the second low acoustic velocity film layer 4b, a $SiO_2$ film having a thickness of about 55 nm was used. As the bonding layer 13, a Ti film was used, and the thickness thereof was set to about 0.5 nm. As the piezoelectric film 5, a $LiTaO_3$ film having a thickness of about 600 nm was used. A wavelength λ determined by the electrode finger pitch of the IDT electrode was set to about 2 μm. The first low acoustic velocity film layer 4a in contact with the piezoelectric film 5 was made of $SiO_2$ as silicon oxide, and the film thickness thereof was changed.

Figure 14:
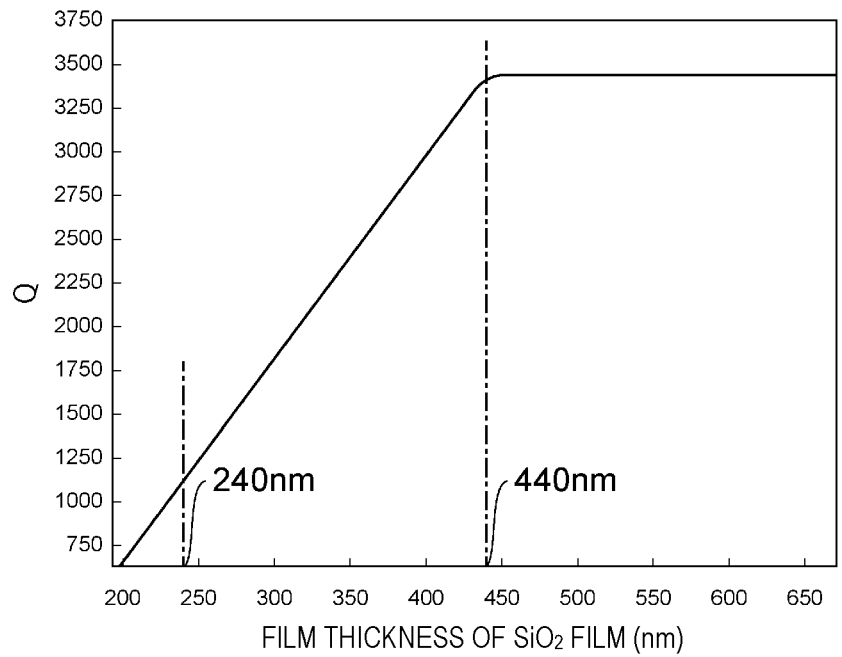
FIG. 14 is a graph showing the relationship between the film thickness of a SiO$_2$ film and the Q factor.

In FIG. 14, the relationship between the Q factor and the film thickness of the $SiO_2$ film defining and functioning as the first low acoustic velocity film layer 4a is shown.

It was discovered that as the film thickness of the $SiO_2$ film defining and functioning as the first low acoustic velocity film layer 4a is increased, the Q factor is increased. When the film thickness of the $SiO_2$ film is about 240 nm or more, that is, is about 0.12λ or more, a high Q factor of more than about 1,000 is obtained. When the film thickness of the $SiO_2$ film is about 440 nm or more, that is, is about 0.22λ or more, the change in Q factor is reduced, and the Q factor becomes approximately constant. Thus, it was discovered that when the film thickness of the $SiO_2$ film is set to about 0.22λ or more, the Q factor becomes constant or approximately constant, and in addition, the variation thereof is also reduced. As described above, when the low acoustic velocity film layer in contact with the piezoelectric film 5 is made of silicon oxide, the film thickness of the $SiO_2$ film is preferably set to about 0.12λ or more, for example. In addition, the film thickness of the $SiO_2$ film is more preferably set to about 0.22λ or more, for example.

In addition, the film thickness of the $SiO_2$ film defining and functioning as the first low acoustic velocity film layer 4a is preferably set to about 2λ or less, for example. Accordingly, the film stress is able to be reduced.

Next, the relationship between the Q factor and the film thickness of a Ti layer defining and functioning as the bonding layer will be described.

The acoustic wave device 31 according to the fifth preferred embodiment shown in FIG. 10 was provided by changing the film thickness of the Ti layer defining and functioning as the bonding layer 13. More particularly, the high acoustic velocity film 3A was made of Si. The bonding layer 13 was made of a Ti layer and a Ti oxide layer. The bonding layer 13 was provided so that the Ti oxide layer was located at a high acoustic velocity film 3A side, and the Ti layer was located at a piezoelectric film 5 side. The thickness of the Ti oxide layer was set to about 50 nm. The low acoustic velocity film was made of $SiO_2$, and the thickness thereof was set to about 700 nm. The piezoelectric film 5 was made of $LiTaO_3$, and the thickness thereof was set to about 600 nm. A wavelength λ of a surface acoustic wave to be used by the acoustic wave device 31 was set to about 2 μm.

Figure 15:
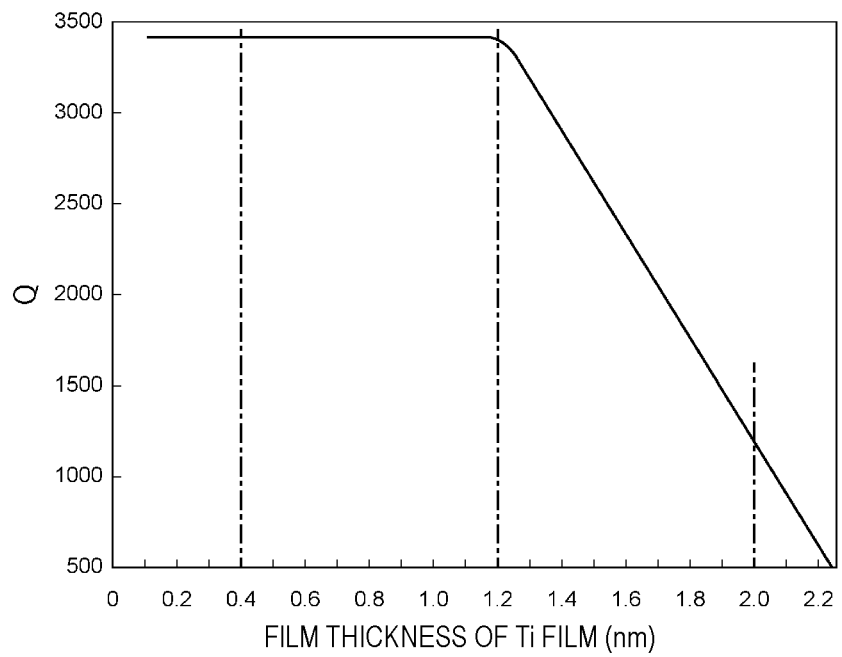
FIG. 15 is a graph showing the relationship between the film thickness of a Ti layer and the Q factor.

FIG. 15 is a graph showing the relationship between the Q factor and the film thickness of the Ti layer defining and functioning as the bonding layer.

It was discovered that as the film thickness of the Ti layer of the bonding layer is decreased, the Q factor is increased. In particular, when the film thickness of the Ti layer is about 2.0 nm or less, that is, is about $1 \times 10^{-3}$λ or less, a high Q factor of more than about 1,000 is obtained. When the film thickness of the Ti layer is about 1.2 nm or less, that is, is about $0.6 \times 10^{31\ 3}$λ or less, the change in Q factor is reduced, and the Q factor becomes approximately constant. Thus, it was discovered that when the film thickness of the Ti layer of the bonding layer is set to about 1.2 nm or less or to about $0.6 \times 10^{-3}$λ or less, the Q factor becomes approximately constant and in addition, the variation thereof are able to be reduced. As described above, the film thickness of the Ti layer is preferably set to about 2.0 nm or less, and the film thickness of the Ti layer is more preferably set to about 1.2 nm or less, for example.

In addition, the film thickness of the Ti layer is preferably set to about 0.4 nm or more, for example. Accordingly, the first laminate and the second laminate preferably are able to be bonded to each other.

Figure 16:
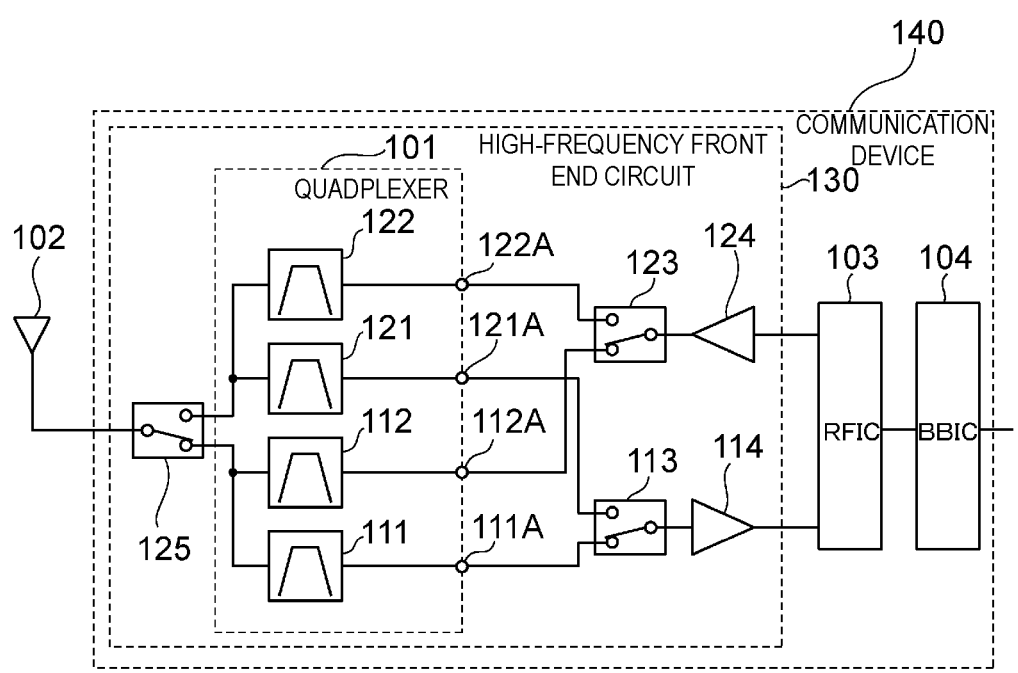
FIG. 16 is a diagram of a high-frequency front end circuit.

FIG. 16 is a diagram of a high-frequency front end circuit 130. In addition, in FIG. 16, various elements (antenna element 102, an RF signal processing circuit (RFIC) 103, and a baseband signal processing circuit (BBIC) 104) to be connected to the high-frequency front end circuit 130 are also collectively shown in the diagram. The high-frequency front end circuit 130, the RF signal processing circuit 103, and the baseband signal processing circuit 104 define a communication device 140. In addition, the communication device 140 may further include a power source, a CPU, and a display.

The high-frequency front end circuit 130 includes an antenna-side switch 125, a quadplexer 101, a reception-side switch 113, a transmission-side switch 123, a low-noise amplifier circuit 114, and a power amplifier circuit 124. In addition, the acoustic wave device 1 may preferably be the quadplexer 101 and/or at least one of filters 111, 112, 121, and 122.

The reception-side switch 113 is a switch circuit including two selective terminals separately connected to a separate terminal 111A and a separate terminal 121A, each of which is a reception terminal of the quadplexer 101, and a common terminal connected to the low-noise amplifier circuit 114.

The transmission-side switch 123 is a switch circuit including two selective terminals separately connected to a separate terminal 112A and a separate terminal 122A, each of which is a transmission terminal of the quadplexer 101, and a common terminal connected to the power amplifier circuit 124.

In accordance with control signals from a control portion (not shown), the reception-side switch 113 and the transmission-side switch 123 each connect the common terminal to a signal path corresponding to a predetermined band and are each preferably defined, for example, by an SPDT (single pole double throw) type switch. In addition, the number of selective terminals to be connected to the common terminal is not limited to one and may be at least two. That is, the high-frequency front end circuit 130 may be applied to carrier aggregation.

The low-noise amplifier circuit 114 is a reception amplifier circuit which amplifies a high-frequency signal (in this case, a high-frequency reception signal) passing through the antenna element 102, the quadplexer 101, and the reception-side switch 113 and which outputs the amplified signal to the RF signal processing circuit 103.

The power amplifier circuit 124 is a transmission amplifier circuit which amplifies a high frequency signal (in this case, a high frequency transmission signal) output from the RF signal processing circuit 103 and which outputs the amplified signal to the antenna element 102 through the transmission-side switch 123 and the quadplexer 101.

The RF signal processing circuit 103 performs signal processing, by a down-converter or other suitable circuit, of a high frequency reception signal input from the antenna element 102 through a reception signal path and outputs the reception signal generated by the signal processing to the baseband signal processing circuit 104. In addition, the RF signal processing circuit 103 performs signal processing, by an up-converter or other suitable circuit, of a transmission signal input from the baseband signal processing circuit 104 and outputs a high frequency transmission signal generated by the signal processing to the power amplifier circuit 124. The RF signal processing circuit 103 is preferably, for example, an RFIC. The signal processed by the baseband signal processing circuit 104 is used, for example, as an image signal for an image display or as a sound signal for a telephone call. In addition, the high-frequency front end circuit 130 may also include, between the elements described above, at least another element.

With the high-frequency front end circuit 130 and the communication device 140, since the quadplexer 101 described above is included, ripples in a passband are able to be reduced or prevented.

In addition, in the high-frequency front end circuit 130, instead of the quadplexer 101, a quadplexer according to a modified example of the quadplexer 101 may be included.

Although acoustic wave devices, high-frequency front end circuits, and communication devices according to preferred embodiments of the present invention have been describe with reference to the preferred embodiments and the modified examples thereof, other preferred embodiments which include arbitrary elements of the above-described preferred embodiments and the modified examples thereof in combination, a modified example obtained by including various modifications of the preferred embodiments conceived by a person skilled in the art without departing from the scope of the present invention, and various apparatuses including high-frequency front end circuits and communication devices according to preferred embodiments of the present invention are also included in the present invention.

For example, in the above description, although a quadplexer or a filter may be used as the acoustic wave device, in a preferred embodiment of the present invention, instead of the quadplexer, for example, a triplexer in which one antenna terminal is commonly used for three filters or a multiplexer, such as a hexaplexer, in which one antenna terminal is commonly used for six filters may also be used. The multiplexer may include at least two filters.

Furthermore, the multiplexer is not limited to the structure in which a transmission filter and a reception filter are both provided and may have a structure in which a transmission filter or a reception filter is only provided.

Preferred embodiments of the present invention may be widely applied to communication apparatuses, such as a mobile phone, as a filter, a multiplexer applicable to a multiband system, a front end circuit, and a communication device.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
a piezoelectric film;
a high acoustic velocity member in which an acoustic velocity of a bulk wave propagating therein is higher than an acoustic velocity of an acoustic wave propagating in the piezoelectric film;
a low acoustic velocity film laminated on the high acoustic velocity member and in which an acoustic velocity of a bulk wave propagating therein is lower than the acoustic velocity of an acoustic wave propagating in the piezoelectric film, the piezoelectric film being laminated on the low acoustic velocity film;
a bonding layer; and
an IDT electrode provided on one surface of the piezoelectric film; wherein
when a wavelength of an acoustic wave which is determined by an electrode finger cycle of the IDT electrode is represented by $\lambda$, a film thickness of the piezoelectric film is about $1.5\lambda$ or more and about $3.5\lambda$ or less;
the high acoustic velocity member includes a high acoustic velocity support substrate; and
the low acoustic velocity film is made of silicon oxide, the bonding layer is provided at a position in the low acoustic velocity film, the low acoustic velocity film includes a first low acoustic velocity film layer located on the bonding layer at a piezoelectric film side and a second low acoustic velocity film layer located on the bonding layer at a side opposite to the piezoelectric film, and when the wavelength of an acoustic wave to be used by the acoustic wave device is represented by $\lambda$, a film thickness of the first low acoustic velocity film layer is about $0.12\lambda$ or more.

2. The acoustic wave device according to claim 1, wherein the high acoustic velocity support substrate is a silicon substrate.

3. The acoustic wave device according to claim 1, wherein the bonding layer includes one of a metal oxide layer and a metal nitride layer.

4. The acoustic wave device according to claim 1, wherein the bonding layer includes a Ti layer, and a film thickness of the Ti layer is about 0.4 nm or more and about 2.0 nm or less.

5. The acoustic wave device according to claim 4, wherein the film thickness of the Ti layer is about 0.4 nm or more and about 1.2 nm or less.

6. The acoustic wave device according to claim 1, wherein the piezoelectric film is made of $LiTaO_3$.

7. The acoustic wave device according to claim 1, wherein the film thickness of the first low acoustic velocity film layer is about $0.22\lambda$ or more.

8. A high-frequency front end circuit comprising:
the acoustic wave device according to claim 1; and
a power amplifier.

9. A communication device comprising:
the high-frequency front end circuit according to claim 8;
an RF signal processing circuit; and
a baseband signal processing circuit.

* * * * *